United States Patent
Li et al.

(10) Patent No.: US 7,924,070 B2
(45) Date of Patent: Apr. 12, 2011

(54) POWER-ON RESET CIRCUIT AND ELECTRONIC DEVICE USING THE SAME

(75) Inventors: Guang-Ze Li, Shenzhen (CN); Chun-Te Wu, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 142 days.

(21) Appl. No.: 12/427,728

(22) Filed: Apr. 21, 2009

(65) Prior Publication Data

US 2009/0267659 A1 Oct. 29, 2009

Related U.S. Application Data

(63) Continuation-in-part of application No. 12/353,974, filed on Jan. 15, 2009, now Pat. No. 7,782,102.

(30) Foreign Application Priority Data

Apr. 28, 2008 (CN) .............. 2008 2 0300643 U
Jul. 18, 2008 (CN) .............. 2008 1 0302806

(51) Int. Cl.
*H03L 7/00* (2006.01)
(52) U.S. Cl. ............................. 327/143; 327/198
(58) Field of Classification Search .......... 327/142, 327/143, 198
See application file for complete search history.

(56) References Cited

U.S. PATENT DOCUMENTS

5,394,104 A * 2/1995 Lee ...................... 327/143
* cited by examiner

*Primary Examiner* — Lincoln Donovan
*Assistant Examiner* — William Hernandez
(74) *Attorney, Agent, or Firm* — Raymond J. Chew (57) ABSTRACT

A power-on reset circuit, connected to an external direct current (DC) power source, to receive DC power signals and generate a reset signal, includes a delay circuit, a combination circuit and a shaping circuit. The delay circuit comprises a plurality of delay units, to delay the received DC power signals and output a plurality of delayed DC power signals. The combination circuit is connected to the delay circuit, to combine the delayed DC power signals into a combination signal, and output the combination signal. The shaping circuit is connected to and turns the combination circuit on and off according to the combination signal and outputs the reset signal.

14 Claims, 8 Drawing Sheets

(Related Art)

FIG. 8

(Related Art)

POWER-ON RESET CIRCUIT AND ELECTRONIC DEVICE USING THE SAME

CROSS-REFERENCE TO RELATED APPLICATIONS

This application is a continuation-in-part of U.S. application Ser. No. 12/353,974, filed on Jan. 15, 2009 now U.S. Pat. No. 7,782,102.

BACKGROUND

1. Technical Field

Embodiments of the present disclosure relate to consumer electronic devices, and particularly to a power-on reset circuit and an electronic device using the same.

2. Description of Related Art

Generally, functional chips employed by electronic products, such as central processing units (CPUs), flash memory, and application specific integrated circuits (ASICs), need to be reset when powered-on. In most applications, specific reset chips, or microcontrollers, such as complex programmable logic devices (CPLDs), and field-programmable gate array (FPGA), are employed for providing reliable reset signals.

Figure 7:
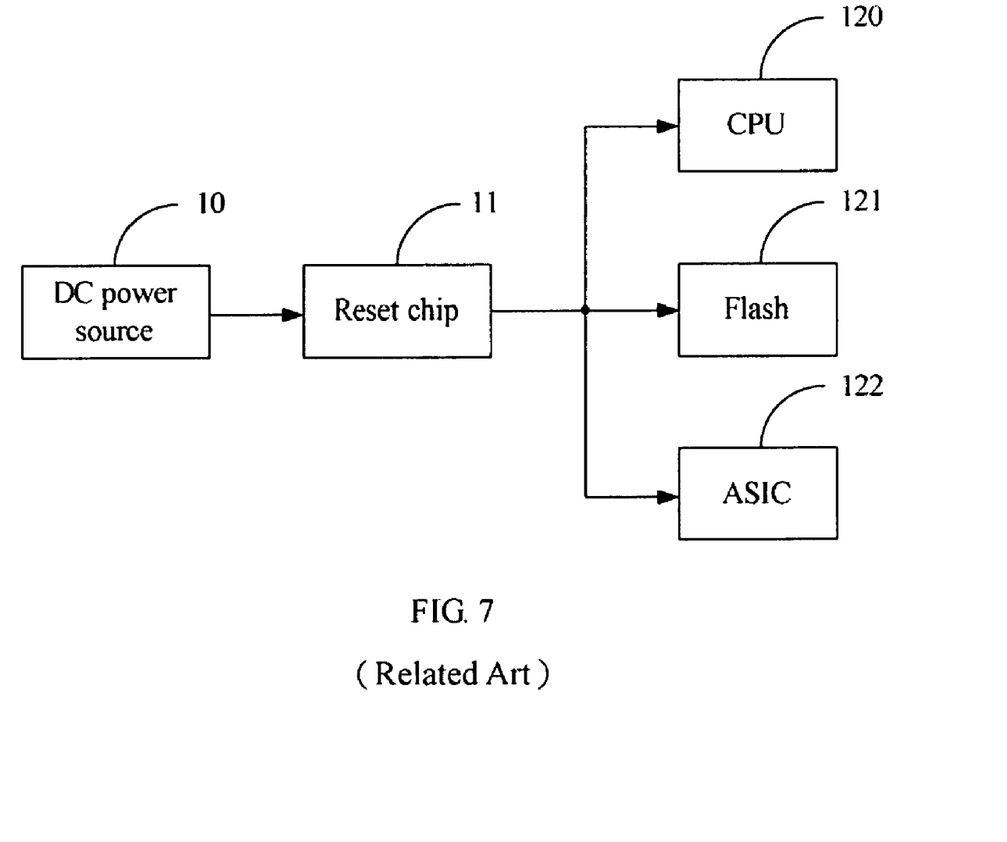
FIG. 7 is a block diagram of a commonly used power-on reset circuit.

FIG. 7 shows one such power-on reset circuit that generates a reset signal for a CPU 120, a flash memory 121, and an ASIC 122 after being powered-on. The power-on reset circuit includes a direct current (DC) power source 10 and a reset chip 11. The DC power source 10 outputs a DC signal to the reset chip 11, and the reset chips 11 then process the DC signal to generate a reset signal to reset the CPU 120, the flash memory 121 and the ASIC 122.

Figure 8:
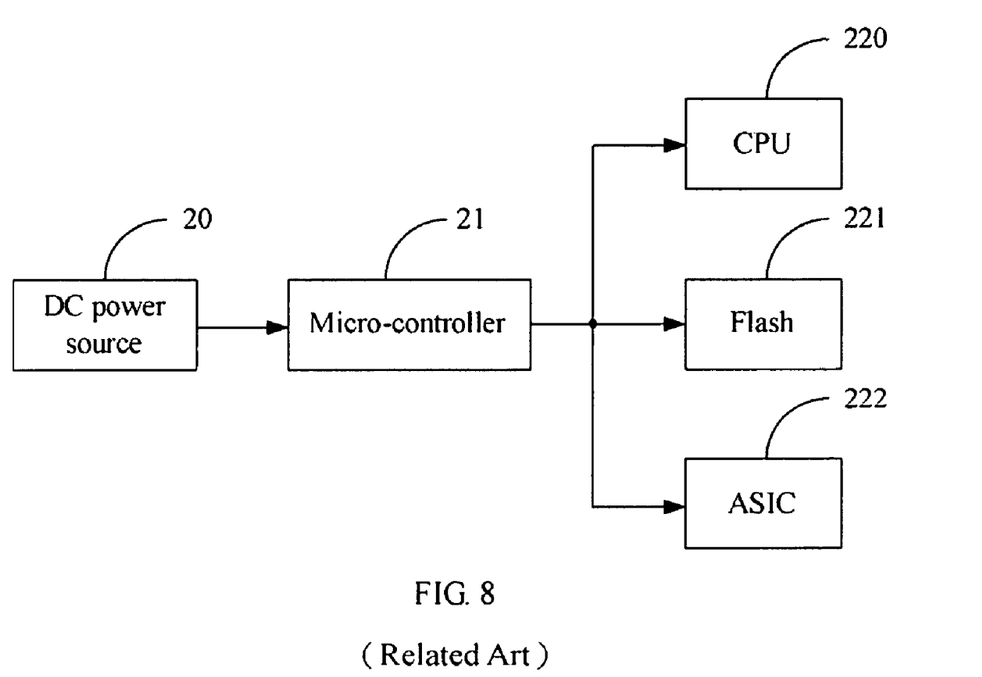
FIG. 8 is a block diagram of another commonly used power-on reset circuit.

FIG. 8 shows another power-on reset circuit that generates a reset signal for a CPU 220, a flash memory 221, and an ASIC 222 after being powered-on. This power-on reset circuit includes a DC power source 20 and a micro-controller 21. The DC power source 20 outputs a DC signal to the micro-controller 21 and the micro-controller 21 then processes the DC signal to generate a reset signal to reset the CPU 220, the flash memory 221 and the ASIC 222.

The power-on reset circuits, as described above, need the special reset chips or micro-controllers to provide the reset signal. That is, the power-on reset circuits require one additional chip to generate the reset signal. Parameters of the additional chip are set by chip manufacturers, and are difficult to adjust. Therefore, the power-on reset circuits have poor flexibility and inevitably increase costs.

DETAILED DESCRIPTION

Figure 1:
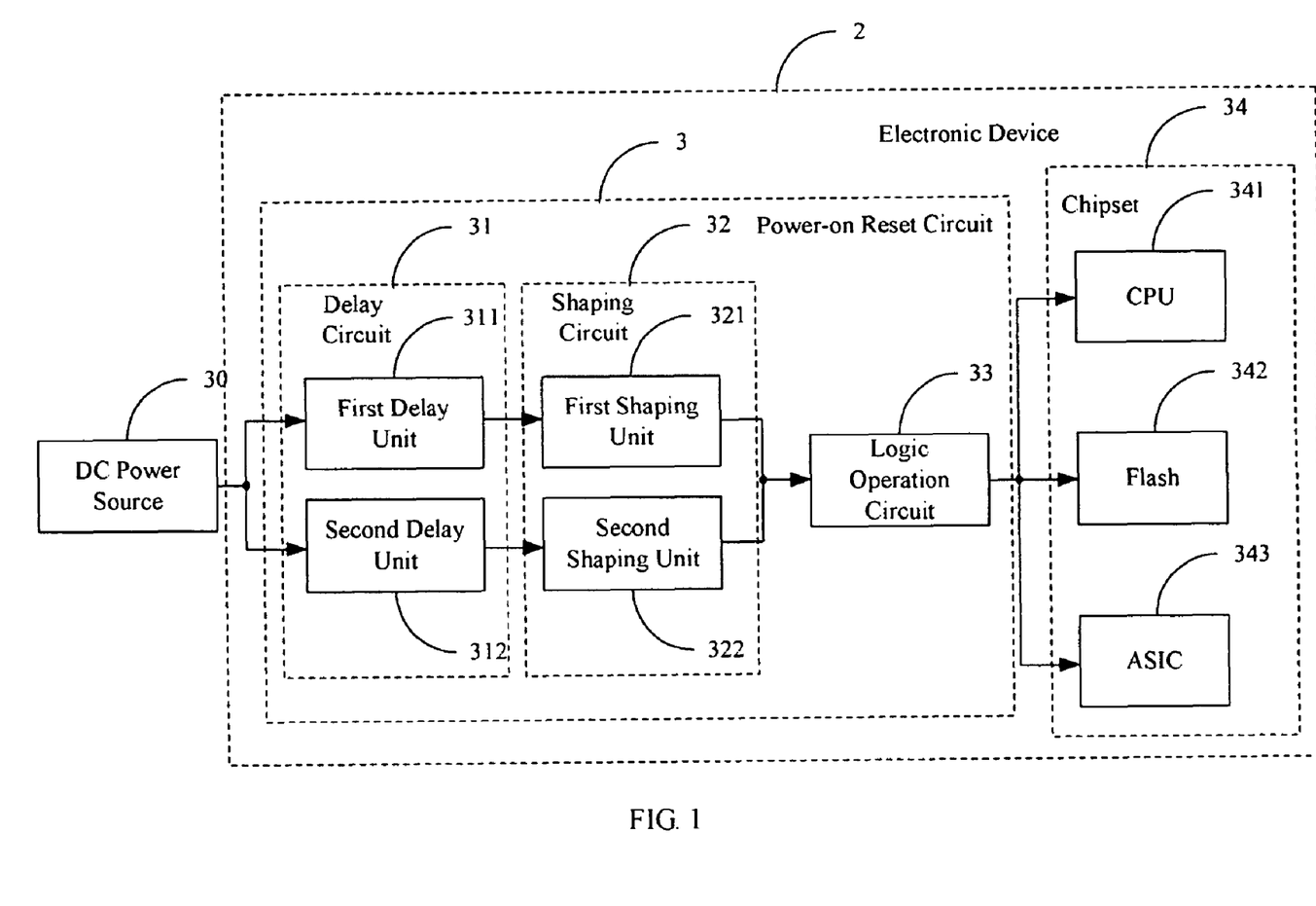
FIG. 1 is a block diagram of a first embodiment of an electronic device of the present disclosure.

FIG. 1 is a block diagram of a first embodiment of an electronic device 2 of the present disclosure. The electronic device 2 comprises a power-on reset circuit 3 and a chipset 34. The power-on reset circuit 3 is connected to and receives direct circuit (DC) power signals from an external DC power source 30, and generates a reset signal to the chipset 34. In one embodiment, the power-on reset circuit 3 comprises a delay circuit 31, a shaping circuit 32, and a logic operation circuit 33. The delay circuit 31 comprises a first delay unit 311 and a second delay unit 312. The shaping circuit 32 comprises a first shaping unit 321 and a second shaping unit 322. The chipset 34 comprises at least one functional chip, such as a central processing unit (CPU) 341, a flash memory 342 and/or an application specific integrated circuit (ASIC) 343.

The first delay unit 311 and the second delay unit 312 are connected in parallel to the DC power source 30. The first delay unit 311 receives a DC power signal output from the DC power source 30 and outputs a first delayed signal according to the received DC power signal. Similar to the first delay unit 311, the second delay unit 312 receives a DC power signal output from the DC power source 30 and outputs a second delayed signal according to the received DC power signal.

The first shaping unit 321 is connected to the first delay unit 311 to shape the first delayed signal to a first shaped signal. The second shaping unit 322 is connected to the second delay unit 312 to shape the second delayed signal to a second shaped signal. The first shaping unit 321 and the second shaping unit 322 can be generally-used shaping circuits, such as Schmitt circuits.

The logic operation circuit 33 is connected to the shaping circuit 32, namely simultaneously connected to the first shaping unit 321 and the second shaping unit 322, to perform logic operations on the first and second shaped signals and output a reset signal to the chipset 34.

Figure 2:
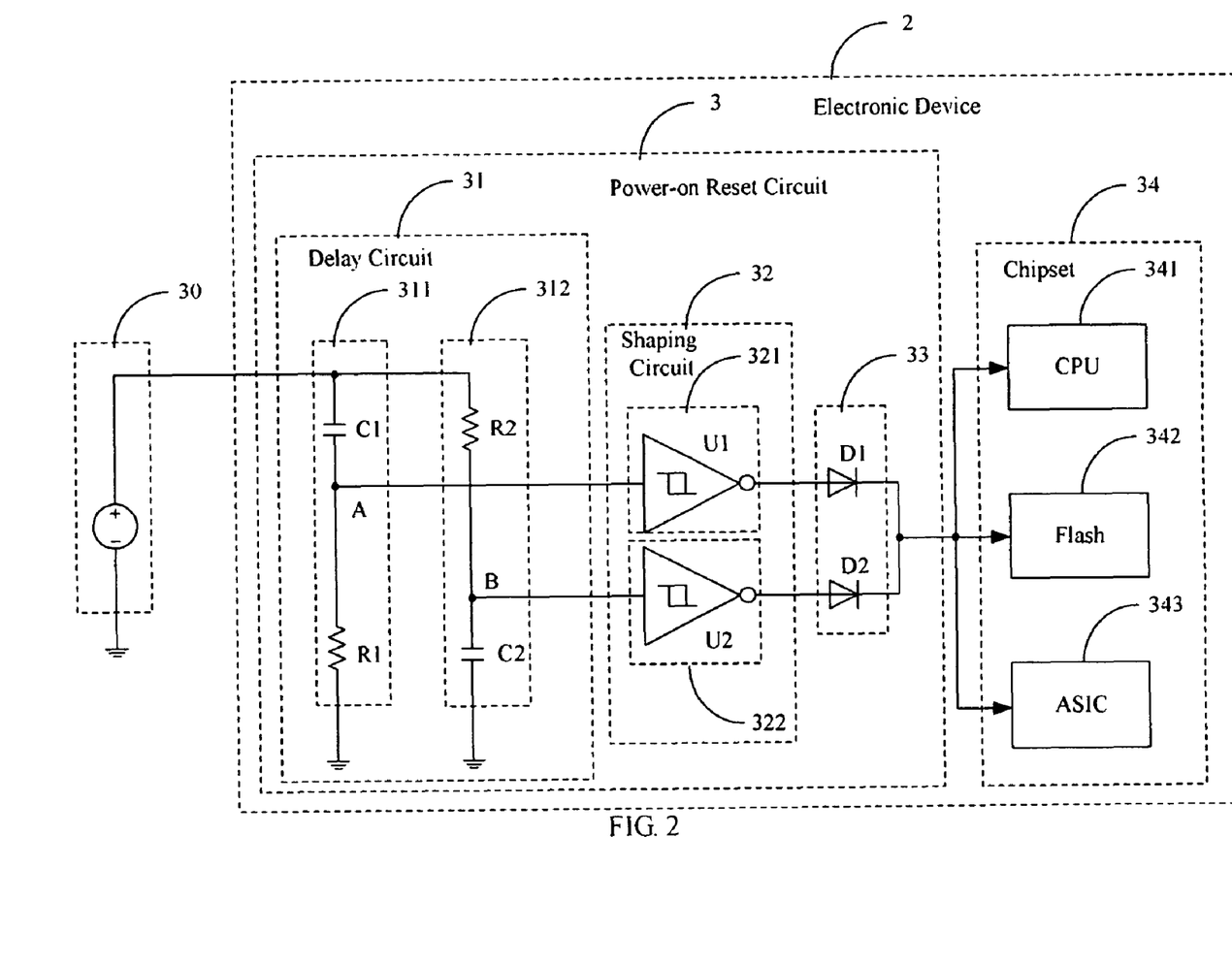
FIG. 2 is a detailed circuit diagram of FIG. 1.

FIG. 2 illustrates a detailed circuit diagram of one embodiment of the circuits of FIG. 1. The first delay unit 311 comprises a first capacitor C1 and a first resistor R1 connected in series between the external DC power source 30 and ground. The first capacitor C1 is charged by the DC power signal output from the DC power source 30. The second delay unit 312 comprises a second resistor R2 and a second capacitor C2, which are connected in series between the DC power source 30 and ground. The second capacitor C2 is charged by the DC power signal output from the DC power source 30.

In the power-on reset circuit 3 of the illustrated embodiment, all parameters of the first capacitor C1 and the first resistor R1 of the first delay unit 311, and the second capacitor C2 and the second resistor R2 of the second delay unit 312, can be adjusted and arranged according to practical requirements. As a result, delay time of the delay circuit 31 can be adjusted as needed.

The first shaping unit 321 comprises a first Schmitt circuit U1 and a second Schmitt circuit U2. The first Schmitt circuit U1 has a first input and a first output. The input of the first Schmitt circuit U1 is connected to a junction A of the first capacitor C1 and the first resistor R1, to receive the first delayed signal. The output of the first Schmitt U1 is connected and outputs the first shaped signal to the logic operation circuit 33. The second shaping unit 322 comprises a second Schmitt circuit U2 having a second input and a second output. The input of the second Schmitt circuit U2 is connected to a junction B of the second capacitor C2 and the second resistor R2, to receive the second delayed signal. The output of the second Schmitt circuit U2 is connected and outputs the second shaped signal to the logic operation circuit 33.

In one embodiment, the first Schmitt circuit U1 and the second Schmitt circuit U2 are Schmitt inverter triggers 74HC14, which output a low voltage signal when triggered, and output a high voltage signal when not triggered. In normal operation, each of the first Schmitt circuit U1 and the second Schmitt circuit U2 have a high voltage level and a low voltage level. If an initial input voltage of the first Schmitt circuit U1 or the second Schmitt circuit U2 is higher than the high voltage level thereof, a trigger voltage thereof is the low voltage level. If the initial input voltage of the first Schmitt circuit U1 or the second Schmitt circuit U2 is lower than the low voltage level thereof, the trigger voltage is the high voltage level.

Here, the high voltage levels of the first Schmitt circuit U1 and the second Schmitt circuit U2 are approximately 2.5-2.6V, and the low voltage levels are approximately 2.3-2.4V. However, it may be understood that these voltages may vary depending on the embodiment and the application of the power-on reset circuit 3.

Alternatively, the first shaping unit 321 and the second shaping unit 322 can use a Schmitt trigger or an inverting Schmitt trigger according to different chip specifications, and can also be composed of discrete elements. Therefore, the shaping parameters of the first shaping unit 321 and the second shaping unit 322 can be adjusted to adjust the trigger voltage thereof according to different requirements.

The logic operation circuit 33 comprises a first diode D1 and a second diode D2. An anode of the first diode D1 is connected to the output of the first Schmitt circuit U1 to receive the first shaped signal. The cathode of the first diode D1 outputs a first logic signal. Accordingly, an anode of the second diode D2 is connected to the output of the second Schmitt circuit U2 to receive the second shaped signal. The cathode of the second diode D2 outputs a second logic signal. Alternatively, the logic operation circuit 33 can use different digital elements according to different chip specifications, such as a logic OR gate arithmetic unit or other logic gate elements.

Figure 3:
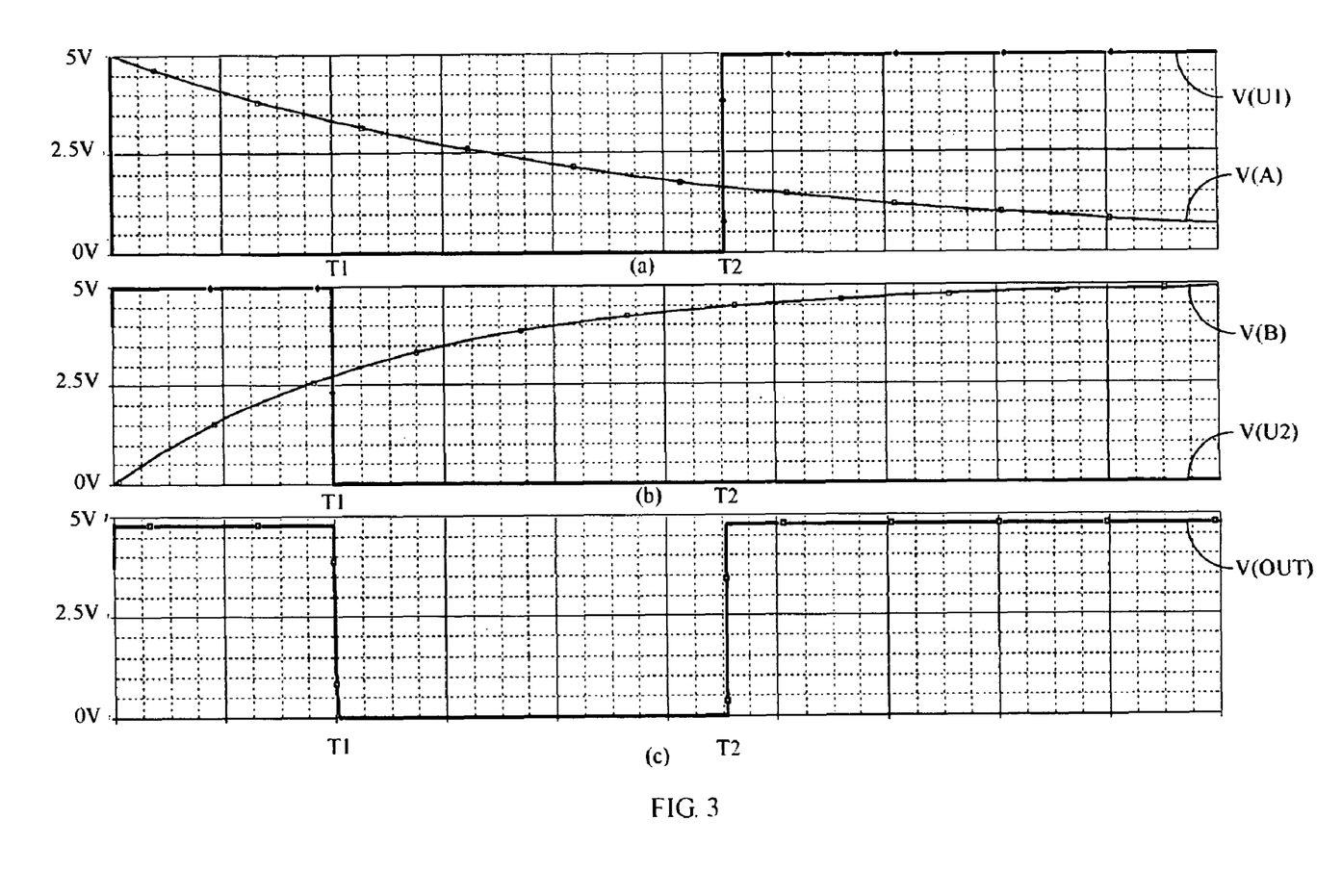
FIG. 3 is an exemplary signal waveform diagram of FIG. 2.

Referring to diagrams (a), (b) and (c) in FIG. 3, at a starting moment (marked as 0 ms in FIG. 3), the power-on reset circuit 3 is powered on. An operation principle of the power-on reset circuit 3 is described as follows.

In diagram (a) of FIG. 3, a line V(A) shows a waveform of the first delayed signal, and a line V(U1) illustrates a waveform of the first shaped signal. In one embodiment, the first capacitor C1 is substantially instantaneously shorted when the DC power source 30 begins to supply power, and the DC power signal from the DC power source 30 is directly loaded on the junction A of the first capacitor C1 and the first resistor R1. As such, the first delayed signal output from the junction A is substantially equal to the power signal. Because the voltage of the DC power signal is higher than the high voltage level of the first Schmitt circuit U1, the first Schmitt circuit U1 is triggered and outputs the first shaping signal at a low voltage level.

Subsequently, the first capacitor C1 begins to charge and the voltage of the first delayed signal begins to decrease. At time T2, voltage of the first delayed signal decreases to the low voltage level of the Schmitt circuit U1, such that the first Schmitt circuit U1 is not triggered, and outputs the first shaping signal at a high voltage level. When the delayed signal is input as a high level, the first shaped signal is output from high voltage level to low voltage level.

In diagram (b) of FIG. 3, a line V(B) shows a waveform of the second delayed signal, and a line V(U2) illustrates a waveform of the second shaped signal. The principle of the second delay unit 312 is opposite to that of the first delay unit 311. In one embodiment, the first capacitor C2 is substantially instantaneously shorted and the power signal flows to ground when the DC power source 30 begins supplying power, therefore the second delayed signal output by a common node B of the second capacitor C2 and the second resistor R2 is zero. Because the high voltage level is the trigger voltage, the second Schmitt circuit U2 is not triggered and the second shaped signal at the high voltage level is output.

Subsequently, the second capacitor C2 opens the circuit between the power source and ground and begins to charge. The power source loads on the junction B, whereby the voltage of the second delayed signal begins to increase until time T1. At T1, the second delayed signal increases to the high voltage level of the Schmitt circuit U2, thus the second Schmitt circuit U2 is triggered, and outputs the second shaping signal at low voltage level outputs. When the delayed signal is input as a low level, the first shaped signal is output from low voltage level to high voltage level.

Diagram (c) of FIG. 3 is a signal reset oscillogram showing the first shaped signal and the second shaped signal, where the line V (OUT) illustrates the reset signal waveform of the logic operation output. Before T1, the first shaping unit 321 outputs the first shaped signal at the low voltage level to the first diode D1, and the second shaping unit 322 outputs the second shaped signal at the high voltage level to the second diode D2. Therefore the first diode D1 is cut off by the first logic signal, which is the low voltage level signal. At this moment, the second diode D2 is on, and the second logic signal is the high voltage level signal, and is thus output by the logic operation circuit 33 at high voltage level.

Between T1-T2, the first shaping unit 321 outputs the first low voltage level shaped signal to the first diode D1 and the second shaping unit 322 outputs the second low voltage level shaped signal to the second diode D2, therefore both of the first diode D1 and the second diode D2 are cut off, and the logic operation circuit 33 outputs a low voltage level signal.

After T2, the first shaping unit 321 outputs the first high voltage level shaped signal to the first diode D1 and the second shaping unit 322 outputs the second low voltage level shaped signal to the second diode D2, therefore the first diode D1 is on and the first logic signal is high. Meanwhile, the second diode D2 is cut off, and the second logic operation is low voltage level and the first logic signal directs the logic operation circuit 33 to output the high voltage level signal.

In one embodiment, T1 is about 4 ms after power-on and T2 is about 11 ms after power-on.

The logic operation circuit 33 logic OR gate operates via the first shaped signal and the second signal to generate a reset signal from high voltage level to low voltage level and then from low voltage level to high voltage level, completing reset of the chipset 34. The power-on reset circuit 3 generates the reset signal to reset the chipset 34 through two delay circuit 311, 312, two shaping circuit 321, 322, and the logic operation circuit 33.

Figure 4:
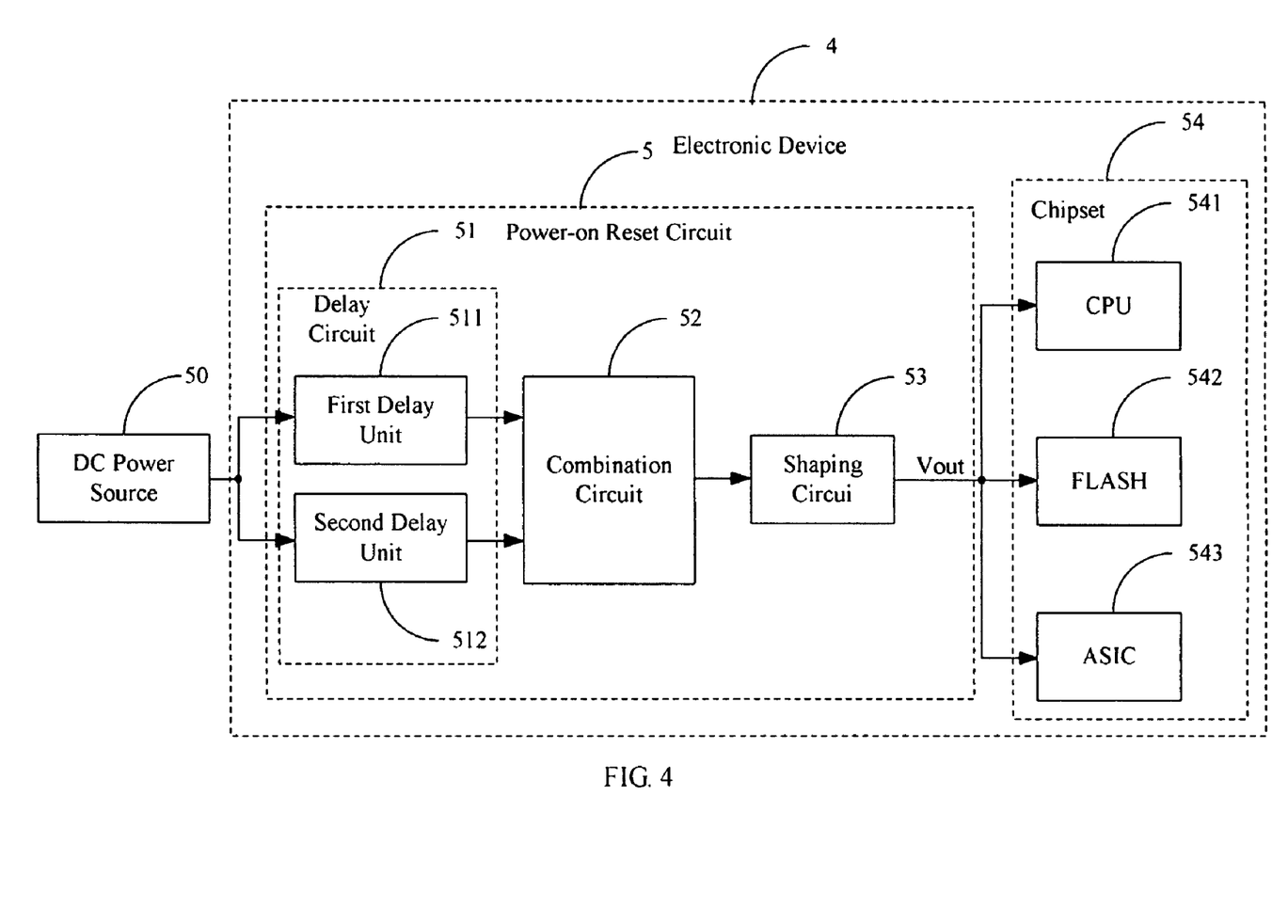
FIG. 4 is a block diagram of a second embodiment of an electronic device of the present disclosure.

FIG. 4 is a block diagram of a second embodiment of an electronic device 4 of the present disclosure. The electronic device 4 comprises a power-on reset circuit 5 and a chipset 54. The power-on reset circuit 5 is connected to and receives DC signals from an external DC power source 50, and generates a reset signal to the chipset 54. Here, the power-on reset circuit 5 comprises a delay circuit 51, a combination circuit 52, and a shaping circuit 53. The delay circuit 51 comprises a first delay unit 511 and a second delay unit 512. The chipset 54 comprises at least one functional chip, such as a central processing unit (CPU) 541, a flash memory 542 and/or an application specific integrated circuit (ASIC) 543.

The first delay unit 511 and the second delay unit 512 are connected in parallel to the DC power source 50. The first delay unit 511 receives a DC power signal output from the DC power source 50 and outputs a first delayed signal according to the received DC power signal. Similar to the first delay unit 511, the second delay unit 512 receives a DC power signal output from the DC power source 50 and outputs a second delayed signal according to the received DC power signal.

The combination circuit 52 is connected to the first delay unit 511 and the second delay unit 512, to combine the first delayed signal and the second delayed signal into a combination signal. In one embodiment, the combination circuit 32 operates a NOR gate arithmetic.

The shaping circuit 33 is connected to the combination circuit 32, to output a reset signal Vout to the chipset 54 according to the combination signal.

Figure 5:
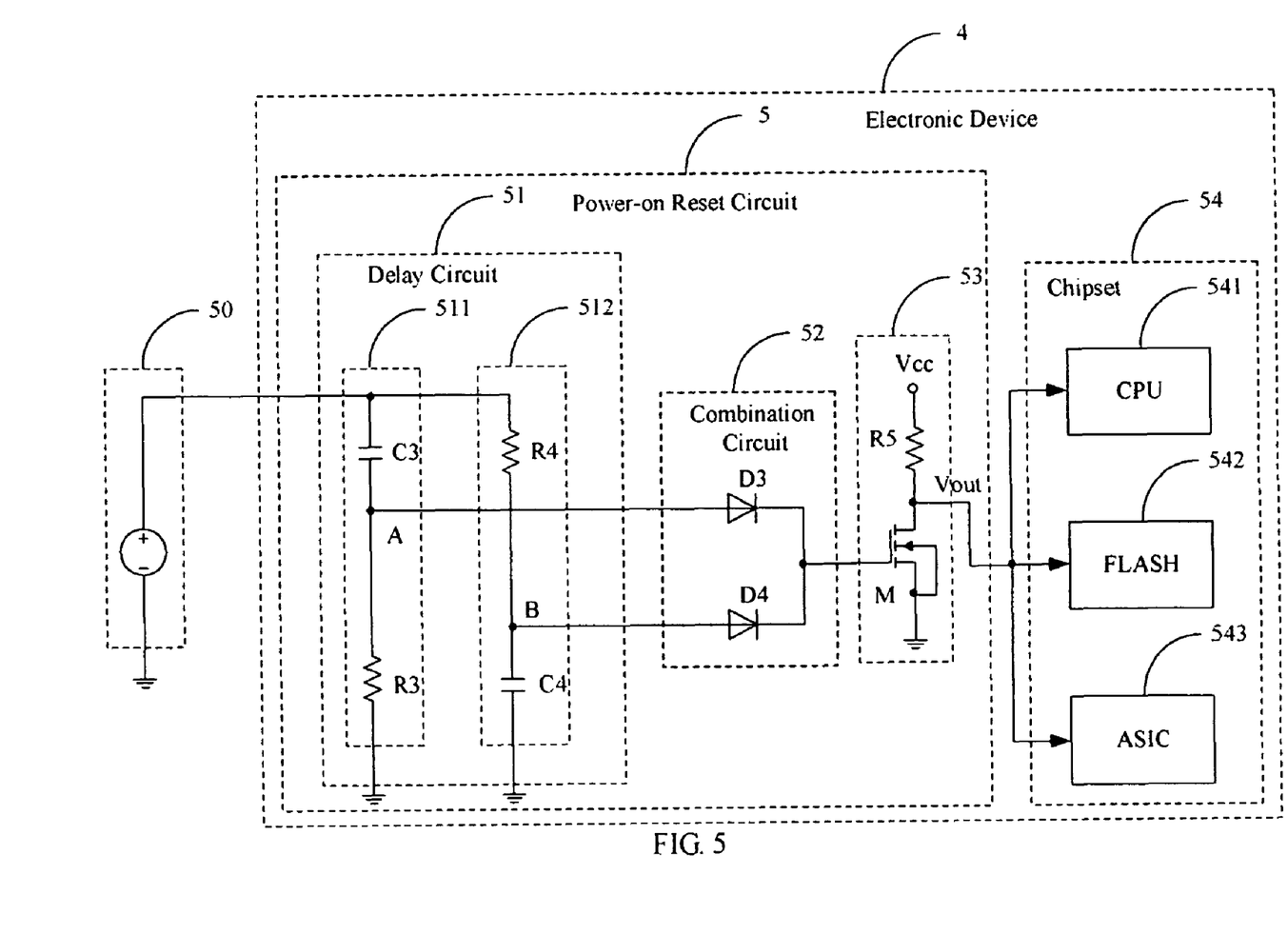
FIG. 5 is a detailed circuit diagram of FIG. 4.

FIG. 5 is a detailed circuit diagram of the device of FIG. 4. The first delay unit 511 comprises a third capacitor C3 and a third resistor R3 connected in series between the external DC power source 50 and ground. The third capacitor C3 is charged by the DC power signal output from the DC power source 50. The second delay unit 512 comprises a fourth resistor R4 and a fourth capacitor C4, which are connected in series between the DC power source 50 and ground. The fourth capacitor C4 is charged by the DC power signal output from the DC power source 50.

In the power-on reset circuit 5 of the illustrated embodiment, all parameters of the third capacitor C3 and the third resistor R3 of the first delay unit 511, and the fourth capacitor C4 and the fourth resistor R4 of the second delay unit 512, can be adjusted and arranged according to practical requirements. Therefore, the delay time of the delay circuit 51 can be adjusted as needed.

The combination circuit 52 comprises a third diode D3 and a second diode D4. An anode of the third diode D3 is connected to a junction A' of the third capacitor C3 and the third resistor R3, and a cathode thereof is connected to the shaping circuit 33, to receive the first delayed signal. An anode of the fourth diode D4 is connected to a junction B' of the fourth capacitor C4 and the fourth resistor R4, and a cathode thereof is connected to the shaping circuit 53, to receive the second delayed signal. In addition, the cathode of the third diode D3 is connected to the cathode of the fourth diode D4, as an output of the combination circuit 52. Alternatively, the combination circuit 52 can be different logic circuits according to different specification of chips, such as a logic NOR gate arithmetic unit or other logic gate elements.

The shaping circuit 53 comprises a fifth resistor R5 and a switch component M. The switch component M comprises a control end, a first output and a second output. The control end of the switch component M is connected to the output of the combination circuit 52. The first output of the switch component M is connected to an external power source Vcc via the fifth resistor R5. The second output of the switch component M is connected to ground. Here, the switch component M is a metal oxide semiconductor field effect transistor (MOSFET). The control end of the switch component M is a base of the MOSFET. The first output of the switch component M is a drain of the MOSFET. The second output of the switch component M is a source of the MOSFET. The first output of the switch component M is defined as an output of the shaping circuit 53, namely an output Vout of the power-on reset circuit 5. The fifth resistor R5 is used for limiting current flowing through the external power source Vcc to the switch component M. In one embodiment, the external power source Vcc is about 3.3V.

Figure 6:
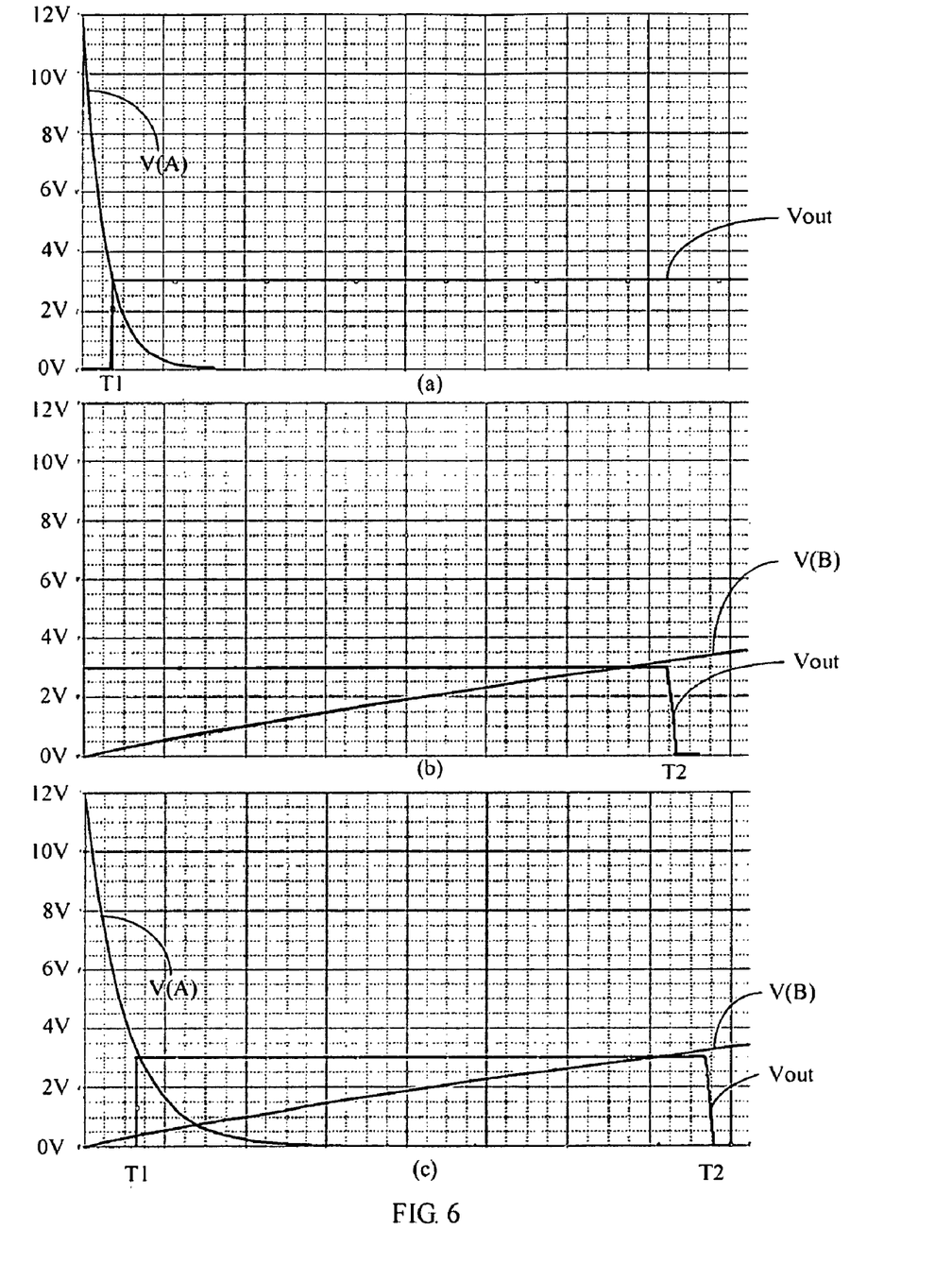
FIG. 6 is an exemplary signal waveform diagram of FIG. 5.

Referring to diagrams (a), (b) and (c) in FIG. 6, at 0 ms, the power-on reset circuit 5 is powered on. Operation of the power-on reset circuit 5 is as follows.

In diagram (a) of FIG. 6, a line V(A)' shows a waveform of the first delayed signal, and Vout shows output of the shaping circuit 53. In this embodiment, the third capacitor C3 is substantially instantaneously shorted when the DC power source 50 begins to supply power, and the power signal from the DC power source 50 is directly loaded on the junction A' of the third capacitor C3 and the third resistor R3. Accordingly, the first delayed signal output from the junction A' is substantially equal to the power signal. Because the voltage of the power signal is higher than a threshold voltage of the third diode D3, the third diode D3 is on and the switch component M is on, thus, the shaping circuit 53 outputs a low logic level.

Subsequently, the third capacitor C3 begins to be charged and the voltage of the first delayed signal begins to decrease. At time T1, voltage of the first delayed signal is lower than the threshold voltage of the third diode D3, therefore the third diode D3 is off, and the switch component M is off. Thus, the shaping circuit 53 outputs a high logic level.

In diagram (b) of FIG. 6, a line V(B)' shows a waveform of the second delayed signal, and Vout shows output of the shaping circuit 53. The principle of the second delay unit 512 is opposite to that of the first delay unit 511. In one embodiment, the fourth capacitor C4 may be shorted. In such a case, the power signal flows to ground when the DC power source 50 begins supplying power. Therefore, the second delayed signal that a common node B' of the fourth capacitor C4 and the fourth resistor R4 outputs is zero. Because the voltage of the second delayed signal is lower than a threshold voltage of the fourth diode D4, the fourth diode D4 is off and the switch component M is off. Thus, the shaping circuit 53 outputs a high logic level.

Subsequently, the fourth capacitor C4 cuts the circuit between the power source and ground and begins to be charged. The DC power signal loads on the junction B', so the voltage of the second delayed signal begins to increase until time T2. At T2, the second delayed signal increases to the threshold voltage of the fourth diode D4, therefore the fourth diode D4 is on and the switch component M is on. Thus, the shaping circuit 53 outputs the low logic level.

Diagram (c) of FIG. 6 is a signal reset oscillogram showing the first shaped signal and the second shaped signal. Before T1, the first shaped signal sets the third diode D3 on, and the second shaped signal sets the fourth diode D4 off. Thus, the switch component M is on, and the shaping circuit 53 outputs a low logic level reset signal.

Between T1-T2, the first delayed signal sets the third diode D3 off, and the second delayed signal sets the fourth diode D4 off. Thus, the switch component M is off, and the shaping circuit 53 outputs a high logic level reset signal.

After T2, the first delayed signal turns the third diode D3 off, and the second delayed signal turns the fourth diode D4 on. Thus, the switch component M is on, and the shaping circuit 53 outputs the low logic level reset signal.

Here, the combination circuit 52 logic NOR operates via the first shaped signal and the second signal to turn the switch component M of the shaping circuit 53 on and off, thus, a reset signal is generated from low voltage level to high voltage level and then from high voltage level to low voltage level to complete the reset of the chipset 54. The power-on reset circuit 5 generates the reset signal to reset the chipset 54 through two delay circuits 511, 512, the combination circuit 52, and the shaping circuit 53.

Although the features and elements of the present disclosure are described in various inventive embodiment in particular combinations, each feature or element can be configured alone or in various within the principles of the present disclosure to the full extent indicated by the broad general meaning of the terms in which the appended claims are expressed.

What is claimed is:

1. A power-on reset circuit, connected to an external direct current (DC) power source, to receive DC power signals and generate a reset signal for at least one functional chip, the power-on reset circuit comprising:
   a delay circuit comprising a plurality of delay units, structured and arrange to delay the received DC power signals and output a plurality of delayed DC power signals, the plurality of delay units each comprising:
      a first delay unit to delay the received DC power signal and output a first delayed signal, the first delay unit comprising a first capacitor and a first resistor connected in series between the external DC power source and ground; and
      a second delay unit to delay the received DC power signal and output a second delayed signal, the second delay unit comprising a second resistor and a second capacitor connected in series between the external DC power source and ground;
   a combination circuit connected to the delay circuit, to combine the plurality of delayed DC power signals together to generate a combination signal; and
   a shaping circuit connected to the combination circuit, the shaping circuit operable to be turned on and off according to the combination signal, and operable to output the reset signal.

2. The power-on reset circuit as claimed in claim 1, wherein the combination circuit comprises:
   a first diode with an anode connected to a junction of the first capacitor and the first resistor, to receive the first delayed signal; and
   a second diode with an anode connected to a junction of the second capacitor and the second resistor, to receive the second delayed signal;
   wherein a cathode of the first diode is connected to a cathode of the second diode to output the combination signal.

3. The power-on reset circuit as claimed in claim 2, wherein the shaping circuit comprises a switch component having a control end, a first output and a second output, wherein the control end of the switch component is connected to the output of the combination circuit, and the first output of the switch component is connected to an external power source, and the second output of the switch component is grounded.

4. The power-on reset circuit as claimed in claim 3, wherein the switch component is a metal oxide semiconductor field effect transistor (MOSFET), wherein the control end is a base of the MOSFET, the first output is a drain of the MOSFET, and the second output is a source of the MOSFET.

5. The power-on reset circuit as claimed in claim 3, wherein the first output of the switch component outputs the reset signal.

6. The power-on reset circuit as claimed in claim 3, wherein the shaping circuit comprises a third resistor connected between the first output of the switch component and the external power source, to limit current flowing through the external power source to the switch component.

7. The power-on reset circuit as claimed in claim 1, wherein the combination circuit is a logic NOR gate circuit.

8. An electronic device, connected to an external DC power source, comprising:
   a chipset; and
   a power-on reset circuit, connected to the external DC power source, to receive DC power signals from the external DC power source and generate a reset signal to reset the chipset, comprising:
   a delay circuit comprising a plurality of delay units, to delay the received DC power signals and output a plurality of delayed DC power signals, the plurality of delay units each comprising:
      a first delay unit to delay the received DC power signal and output a first delayed signal, the first delay unit comprising a first capacitor and a first resistor connected in series between the external DC power source and ground; and
      a second delay unit to delay the received DC power signal and output a second delayed signal, the second delay unit comprising a second resistor and a second capacitor connected in series between the external DC power source and ground;
   a combination circuit connected to the delay circuit, to combine the delayed DC power signals into an operating signal, and output the combination signal; and
   a shaping circuit connected to the combination circuit, the shaping circuit operable to be turned on and off according to the combination signal, and operable to output the reset signal.

9. The electronic device as claimed in claim 8, wherein the combination circuit comprises:
   a first diode with an anode connected to a junction of the first capacitor and the first resistor, to receive the first delayed signal; and
   a second diode with an anode connected to a junction of the second capacitor and the second resistor, to receive the second delayed signal;
   wherein a cathode of the first diode is connected to a cathode of the second diode, to output the combination signal.

10. The electronic device as claimed in claim 9, wherein the shaping circuit comprises a switch component having a control end, a first output and a second output, wherein the control end of the switch component is connected to the output of the combination circuit, and the first output of the switch component is connected to the external power source, and the second output of the switch component is grounded.

11. The electronic device as claimed in claim 10, wherein the switch component is a metal oxide semiconductor field effect transistor (MOSFET), wherein the control end is a base of the MOSFET, the first output is a drain of the MOSFET and the second output is a source of the MOSFET.

12. The electronic device as claimed in claim 10, wherein the first output end of the switch component outputs the reset signal.

13. The electronic device as claimed in claim 10, wherein the shaping circuit comprises a third resistor, connected between the first output of the switch component and the external power source, to limit current flowing through the external power source to the switch component.

14. The electronic device as claimed in claim 8, wherein the combination circuit is a logic NOR gate circuit.

* * * * *